United States Patent [19]

Gilder, Jr. et al.

[11] Patent Number: 4,554,404

[45] Date of Patent: Nov. 19, 1985

[54] SUPPORT FOR LEAD FRAME FOR IC CHIP CARRIER

[75] Inventors: Thomas G. Gilder, Jr., York; Raymond D. O'Dean, Dover, both of Pa.

[73] Assignee: Gte Products Corporation, Stamford, Conn.

[21] Appl. No.: 593,458

[22] Filed: Mar. 26, 1984

[51] Int. Cl.[4] ...................... H01L 23/28; H01L 23/50
[52] U.S. Cl. .............................. 174/52 FP; 206/330; 357/70
[58] Field of Search .......... 174/138 R, 138 G, 52 FP, 174/52 PE; 361/421; 357/80, 70; 29/827, 831, 844; 206/330

[56] References Cited

U.S. PATENT DOCUMENTS

| 3,469,684 | 9/1969 | Keady et al. | 174/52 FP X |
| 3,838,984 | 10/1974 | Crane et al. | 357/80 X |
| 4,107,555 | 8/1978 | Haas et al. | 357/80 X |
| 4,138,691 | 2/1979 | Bonkohara et al. | 357/80 X |
| 4,218,701 | 8/1980 | Shirasaki | 357/80 X |
| 4,381,602 | 5/1983 | McIver | 174/52 PE X |

Primary Examiner—Laramie E. Askin
Attorney, Agent, or Firm—James Theodosopoulos; William H. McNeill

[57] ABSTRACT

A support for a lead frame for use with an integrated circuit chip is made of electrically insulative material, preferably a thermoplastic. There is a pad area at the center of the support in which an IC chip can be disposed. Proximate the periphery of the pad are raised spaced-apart projections. The spaces between the projections define slots in which the leads of a lead frame can be disposed.

6 Claims, 8 Drawing Figures

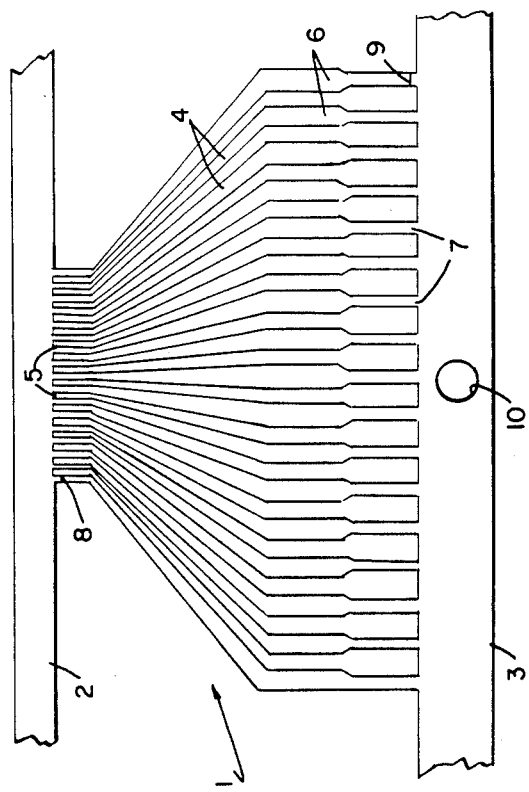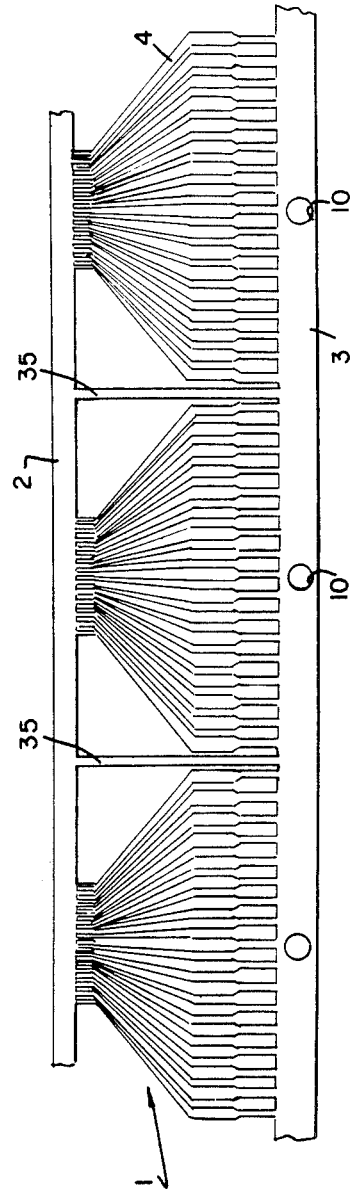

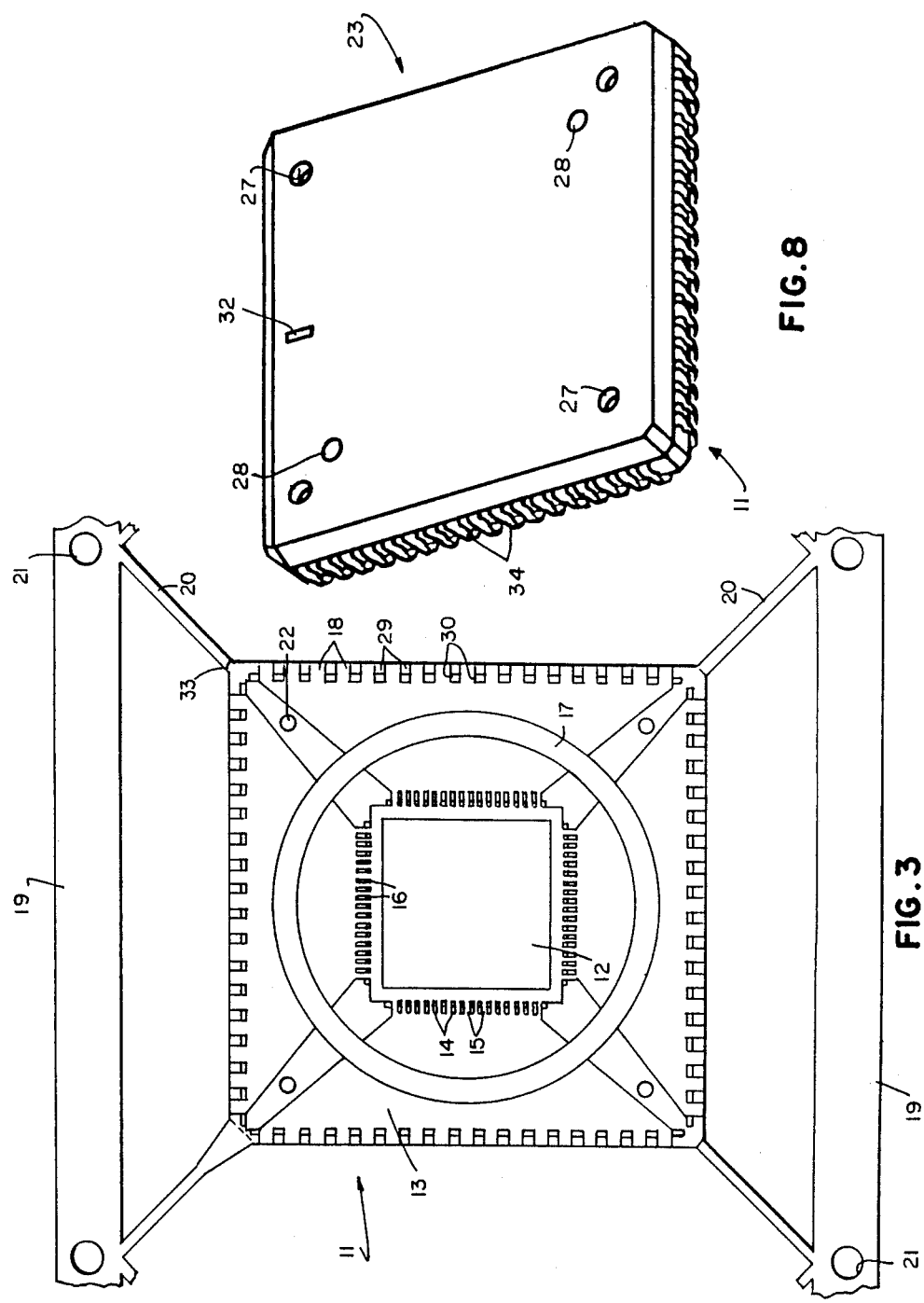

SUPPORT FOR LEAD FRAME FOR IC CHIP CARRIER

This invention concerns lead frames for use with integrated circuit chips. The manufacture of such lead frames is disclosed in, for example, the following U.S. Pat. Nos. 4,204,317; 4,137,546; 3,750,277; 3,537,175; 3,469,953. After an IC chip has been mounted on a lead frame chip carrier, and electrically connected to the leads thereof, it is often packaged in encapsulating material. Such packaged chip-containing lead frames are shown in, for example, the following U.S. Pat. Nos. 4,331,831; 4,301,464; 4,298,883; 4,264,917; 4,214,364; 4,132,856; 4,124,864; 4,079,511; 3,978,516; 3,793,474; 3,684,464; 3,659,821; 3,611,061; 3,436,810.

As pointed out in the above patents, the lead frames are usually made by stamping or etching metal strips. Where the manufactured quantities are sufficiently great, stamping is preferred because of its lower cost.

As the circuits on the chips become more complex, a greater number of leads per lead frame is required. This complicates the stamping operation. Stamping is carried out in progressive dies; that is, a metal strip is fed through a stamping press having successive punch and die sets at a number of stations, where successive stamping operations are carried out. For example, a lead frame having 68 leads would require about 15 to 20 stamping stations and about 140 to 150 cuts. As the number of required stamping stations and cuts increases, the difficulty in maintaining adequate quality of the stamped lead frames also increases.

It is a purpose of this invention to reduce the number of required stamping stations and cuts per lead frame. This is accomplished by not making an entire lead frame out of one integral metal strip, as was done in the prior art. Instead, the lead frame is fabricated from a plurality of segments which can be fabricated from the same set of stamping tools. Thus, if two segments are used per lead frame, the number of stamping stations can be about halved and the number of cuts can be reduced even more. And if four segments are used per lead frame, the number of stamping stations and cuts can be reduced an even greater extent. The lead frame is manufactured by assembling the segments with precise positioning, and then securing the segments in a suitable support to maintain said precise positions. An IC chip can then be disposed thereon and electrically connected to the leads.

This invention is particularly concerned with a support for such a lead frame. Such a support is made of electrically insulative material, has a pad area at the center thereof and has raised spaced-apart projections proximate the periphery of the pad area. The spaces between the projections define slots in which the leads of a lead frame can be disposed.

In the drawing,

FIG. 1 shows a lead frame segment after stamping and FIG. 2 shows a strip of such lead frame segments.

FIG. 3 is a plan view of a support for a lead frame.

FIG. 8 shows the finished chip-containing lead frame package.

Figures 4, 5:
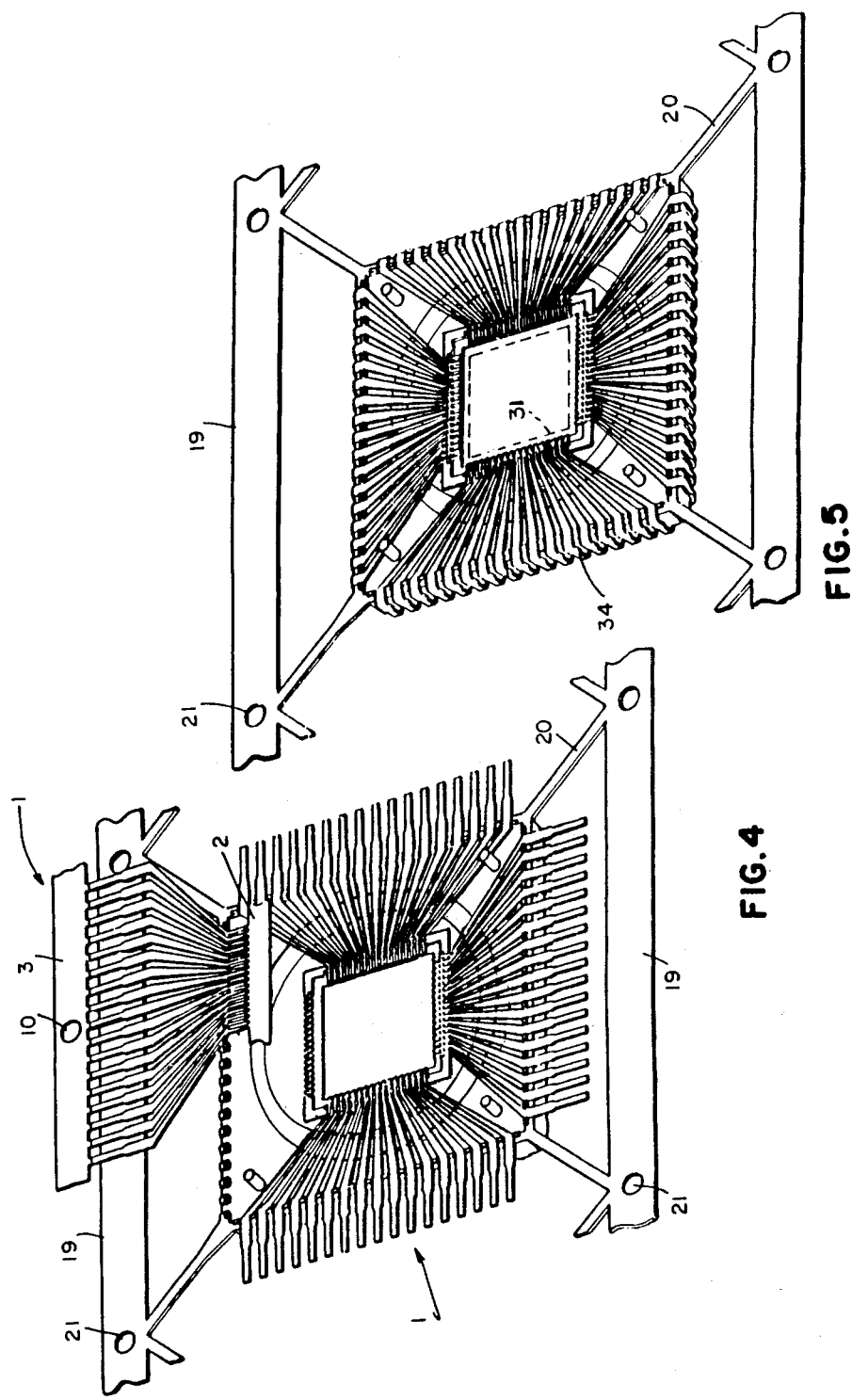
FIG. 4 shows the support with three lead frame segments attached and the fourth ready for attachment.
FIG. 5 shows the support with all lead frame segments attached and the leads formed.
Figure 6:
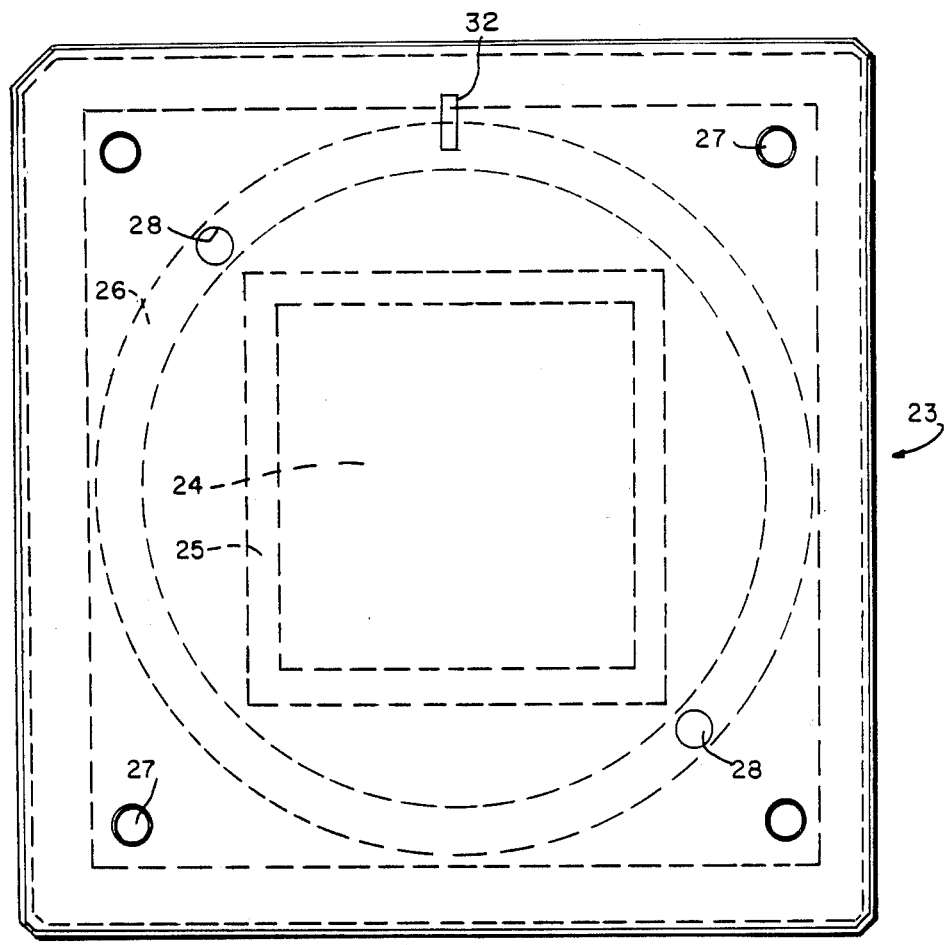
FIGS. 6 and 7 are plan and end views of a cover for the support.

In one embodiment, substantially identical lead frame segments 1 were stamped from a long metal strip, as shown in FIG. 2. One such segment 1 is shown in FIG. 1. In one example, segments 1 were stamped from 10 mil copper alloy, specifically, Olin CDA194, and were maintained in strip form by means of continuous rails 2 and 3, as shown in FIG. 2. Between segments 1, there were support bars 35 extending from rail 3 to rail 2. Each segment 1 comprised seventeen leads 4. The inner ends 5 of leads 4, which would eventually be electrically connected to an IC chip, were 9 mils wide and spaced 9 mils apart. The widest parts 6 of leads 4 were inward from the outer ends 7 thereof and were 28 mils wide spaced 22 mils apart. Outer ends 7 were 18 mils wide spaced 32 mils apart. There were score lines 8 and 9 on leads 4 about 5 mils from rails 2 and 3. Rails 2 and 3 would eventually be broken off at score lines 8 and 9. There were 62 mil diameter holes 10 in rail 3, which provided means for precise positioning of the lead frame segments during indexing of the copper strip during processing. Rails 2 and 3 were 63 and 100 mils wide, respectively. The distance between score lines 8 and 9 was 480 mils.

Support 11 for this example, shown in FIG. 3, was made of a high temperature thermoplastic material, specifically, a polyetherimide resin made by General Electric Co., Pittsfield, Mass., under the trade name Ultem. In the center of support 11 was a pad area 12 in which an IC chip would eventually be disposed. Pad area 12 was 340 mils square and was recessed 8 mils below surface 13 of support 11. Surrounding pad area 12 were seventy-two raised projectons 14, eighteen per side. Projections 14 were 7 mils wide by 25 mils long by 9 mils high. Spaces 15 between the projections were 11 mils wide. At assembly of segments 1 to support 11, narrow ends 5 of leads 4 would lie on surface 13 in spaces 15 between projections 14. This provides means for accurate co-planar positioning of ends 5 in support 11. On the inner end of each projection 14 was another raised portion 16, measuring 7 mils wide by 10 mils long by 6 mils high. Raised portions 16 provided means for securing the leads in spaces 15 by, for example, heating and slightly flowing plastic portions 16 over the leads. There was an encircling trough 17 outside the perimeter formed by all the projections 14.

At the periphery of support 11 there were sixty-eight slots 18 in whch parts 6 of leads 4 would fit. Slots 18 were formed by projections 29 which were similar to projections 14 but bigger. Projections 29 were 20 mils wide by 32 mils long by 9 mils high. Slots 18 were 30 mils wide. There were raised portions 30 on the inner ends of projections 29, similar to raised portions 16 on projections 14. Raised portions 30 were 20 mils wide by 10 mils long by 6 mils high.

In order to permit supports 11 to be processed in existing manufacturing equipment for chip-carrying lead frames, there were rails 19, compatible with said equipment, spaced from each side of support 11 and connected thereto by tie bars 20. Rails 19 were 10 mils thick by 135 mils wide and were 1.400 inches apart from each other. Holes 21 provided means for accurate positioning of the supports during indexing. There were four posts 22 on support 11 for accurate mating of support 11 with cover 23, which was made of the same plastic as support 11.

Cover 23 had a recess 24 to mate with pad area 12, and had an additional recess 25 to accommodate projections 14. Cover 23 also had a trough 26 to mate with trough 17, and four holes 27 into which posts 22 fit. There were also two holes 28 connecting with trough 26. After assembly of cover 23 onto support 11, a sealant material could be injected into holes 28 to fill troughs 17 and 26 in order to seal the IC chip from the environment.

Assembly of the components would proceed as follows. Four lead frame segments 1, with rails 2 and 3 still attached, would be placed on top of support 11, one at a time and one in each quadrant, as shown in FIG. 4. Each segment 1, with rails 2 and 3 still attached thereto but with rail 2 having been trimmed sufficiently to fit the space, as shown in FIG. 5, would be carefully positioned so that ends 5 lie in spaces 15 and parts 6 lie in slots 18. Pressure would then be applied to segment 1 to ensure that it was flush against surface 13 and then, maintaining the pressure, heat would be applied to portions 16 and 30 to cause them to flow over, and secure in place, ends 5 and parts 6 of leads 4. Rails 2 and 3 would then be broken off at score lines 8 and 9. This process would be repeated for each lead frame segment 1. This construction ensures accurate positioning, with secure attachment, of all sixty-eight leads with excellent co-planarity thereof.

Next, an IC chip 31, shown in dotted lines in FIG. 5, would be conventionally attached in pad area 12, and would be conventionally electrically connected to ends 5 of leads 4. The rail construction of support 11 permits this processing to be performed on existing chip-carrier lead frame processing equipment. An advantage of this invention is that the IC chip and package can now be tested for electrical characteristics, because all sixty-eight leads are now electrically isolated, and repair of electrical connections can be made, if necessary. In the past, such repair could not be made because the leads were not electrically isolated until after packaging. The external ends of leads 4 are formed into a desired shape, such as "J" lead shape 34 shown in FIGS. 5 and 8.

Figure 7:
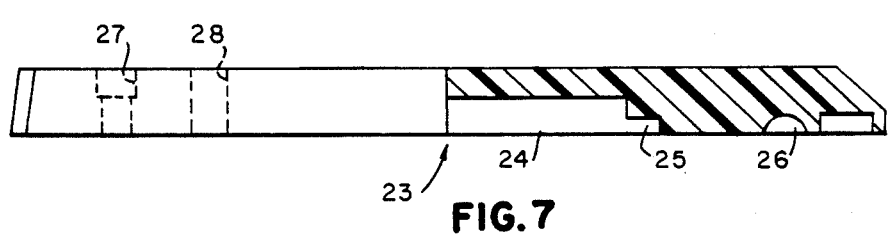

Next, cover 23 is placed on support 11, posts 22 fitting into holes 27. Holes 27 are counterbored about half-way through as shown in FIG. 7, for example, to 43 mils diameter from 33 mils diameter. Posts 27 extend somewhat in the counterbores of holes 27, thereby providing the means for securing cover 23 to support 11 by heat-flowing the extending upper ends of posts 27, as raised portions 16 and 30 were heat-flowed. Next, a sealant, for example, a silicone gel, is pumped into holes 28 to completely fill troughs 17 and 26 as well as holes 28. The sealant should be sufficiently adherent and flexible, after curing, to maintain a seal through normal thermal cycling requirements. If desired, assembly of cover 23 and sealing of troughs 17 and 26 can be performed in an atmosphere having greater heat dissipation characteristics than air, such as helium. This atmosphere will be sealed in the recesses in which chip 31 is disposed. To complete the package, a lead identifier 32 may be used, as shown in FIG. 8, and rails 19 and tie bars 20 are removed at score lines 33.

The finished unit, shown in FIG. 8, had overall measurements, including formed leads 34, of 988 mils square by 175 mils high.

This invention is also applicable to lead frames made other than by stamping, such as etching or chemical forming. There, a significant advantage to the use of segments as per this invention is a substantial reduction in tooling cost.

We claim:

1. A lead frame support comprising a support made of an electrically insulative, thermoplastic material, a pad area at the center of said support in which an IC chip can be disposed, said pad area being square or rectangular, and first raised spaced-apart projections proximate the periphery of said pad area, on all four sides thereof, the spaces between the projections defining slots in which the leads of a lead frame can be disposed.

2. The lead frame support of claim 1 wherein said leads of said lead frame can be secured in said slots by heating and slightly flowing said projections over said leads.

3. The lead frame support of claim 2 wherein there is a trough in the support encircling said pad area and said first projections.

4. The lead frame support of claim 3 comprising, in addition, second raised spaced-apart projections proximate the periphery of said support, the spaces between said second projections defining slots in which said leads of said lead frame can be disposed.

5. The lead frame support of claim 4 wherein said pad area is recessed.

6. The lead frame support of claim·5 wherein said support has four sides and there are removable rails at only two of said sides, said rails being oppositely disposed from one another and being spaced from, and connected to, said support by tie bars.

* * * * *